(12) United States Patent
Lu et al.

(10) Patent No.: US 8,674,953 B2
(45) Date of Patent: Mar. 18, 2014

(54) METHOD OF FABRICATING TOUCH PANEL

(75) Inventors: Ying-Chi Lu, Hsin-Chu (TW); Shu-Hui Huang, Hsin-Chu (TW); Shih-Po Chou, Hsin-Chu (TW); Seok-Lyul Lee, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 663 days.

(21) Appl. No.: 12/768,716

(22) Filed: Apr. 27, 2010

(65) Prior Publication Data
US 2011/0148780 A1    Jun. 23, 2011

(30) Foreign Application Priority Data
Dec. 21, 2009  (TW) ................................ 98143889 A

(51) Int. Cl.
G06F 3/041       (2006.01)
(52) U.S. Cl.
USPC ............................................. 345/173; 216/13
(58) Field of Classification Search
USPC ................................................. 345/137–178
See application file for complete search history.

(56) References Cited

U.S. PATENT DOCUMENTS

| | | | |
|---|---|---|---|
| 7,511,702 B2 * | 3/2009 | Hotelling ....................... | 345/173 |
| 8,115,751 B2 * | 2/2012 | Lin ............................... | 345/174 |
| 8,184,105 B2 * | 5/2012 | Lin et al. ....................... | 345/173 |
| 8,232,975 B2 * | 7/2012 | Wu et al. ....................... | 345/173 |
| 8,358,284 B2 * | 1/2013 | Jeong et al. .................... | 345/174 |
| 2007/0279395 A1 | 12/2007 | Philipp | |
| 2008/0309635 A1 * | 12/2008 | Matsuo ......................... | 345/173 |
| 2009/0184937 A1 | 7/2009 | Grivna | |
| 2010/0013784 A1 * | 1/2010 | Nashiki et al. ................. | 345/173 |

FOREIGN PATENT DOCUMENTS

| | | |
|---|---|---|
| CN | 101441545 A | 5/2009 |
| CN | 101452362 A | 6/2009 |
| TW | 569954 | 1/2004 |
| TW | 200705541 | 2/2007 |
| TW | I277780 | 4/2007 |
| TW | M347284 | 12/2008 |
| TW | I310148 | 5/2009 |

* cited by examiner

*Primary Examiner* — Alexander Eisen
*Assistant Examiner* — Robin Mishler
(74) *Attorney, Agent, or Firm* — Winston Hsu; Scott Margo

(57) ABSTRACT

A method of fabricating touch panel includes the following steps. A base is provided. A first transparent conductive layer is formed on the base. A first screen printing process is performed to form a first patterned sacrificial layer on the first transparent conductive layer, and the first patterned sacrificial layer is used to pattern the first transparent conductive layer to form a patterned sensing pad layer. A second screen printing process is carried out to form a patterned insulating layer. A second transparent conductive layer is formed on the base. A third screen printing process is performed to form a second patterned sacrificial layer, and the second patterned sacrificial layer is used to pattern the second transparent conductive layer to form a patterned bridge line layer.

19 Claims, 12 Drawing Sheets

METHOD OF FABRICATING TOUCH PANEL

BACKGROUND OF THE INVENTION

1. Field of the Invention

The present invention relates to a touch panel and a fabricating method thereof, and more particularly to a touch panel and a fabricating method thereof utilizing screen printing processes to form a patterned sensing pad layer, a patterned insulating layer, and a patterned bridge line layer of the touch panel.

2. Description of the Prior Art

In the present consumer electronic product market, touch panels have been widely applied in portable electronic products such as mobile phone, global positioning system (GPS), digital media player, and the touch panels act as human machine interface (HMI). Since the demands of the present consumer electronic products tend to be light in weight, thin in profile and short in size, the idea of replacing the conventional input devices such as keyboard and mouse with the touch panels could effectively reduce the size of the electronic devices; therefore, the touch panels have become one of the key components in the present consumer electronic product market.

Nowadays, the touch panels are classified into resistance/contact touch panels and capacitive touch panels by their differences in touch sensing methods. The capacitive touch panels are the mainstream of the present touch panel market. The sensing pads, and the film layers such as the insulating layer and the bridge line of the conventional capacitive touch panels are respectively formed using a photolithography process, so that the manufacturing process is expensive and the high manufacturing cost ultimately affects the popularity of the capacitive touch panels.

SUMMARY OF THE INVENTION

It is one of the objectives of the present invention to provide a touch panel and a fabricating method thereof for reducing the manufacturing cost of the touch panel.

A preferred embodiment in accordance with the present invention provides a method of fabricating a touch panel, including the following steps. A base is provided, and the base includes a sensing region. A first transparent conductive layer is formed in the sensing region of the base. The first transparent conductive layer is patterned to form a patterned sensing pad layer by performing a first screen printing process using a first patterned sacrificial layer. A patterned insulating layer is formed in the sensing region of the base by performing a second screen printing process. A second transparent conductive layer is formed in the sensing region of the base. The second transparent conductive layer is patterned to form a patterned bridge line layer by performing a third screen printing process using a second patterned sacrificial layer.

Another preferred embodiment in accordance with the present invention provides a touch panel. The touch panel includes a base, a patterned sensing pad layer, a patterned bridge line layer, and a patterned insulating layer. The base includes a sensing region. The patterned sensing pad layer made of polycrystalline metal oxide is disposed in the sensing region of the base. The patterned bridge line layer made of polycrystalline metal oxide is disposed in the sensing region of the base. The patterned insulating layer is disposed between the patterned sensing pad layer and the patterned bridge line layer.

Since the method of fabricating the touch panel in accordance with the present invention utilizes screen printing processes to define both a patterned sacrificial layer of the patterned sensing pad layer and a patterned sacrificial layer of the patterned bridge line layer, the method of fabricating the touch panel in accordance with the present invention can greatly reduce the manufacturing cost in comparison to the conventional method which uses a photolithography process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved. Furthermore, the terms "first", "second", "third" and "fourth" are used to distinguish between different devices or processes, and do not limit the sequence of the devices or processes.

Figure 1:
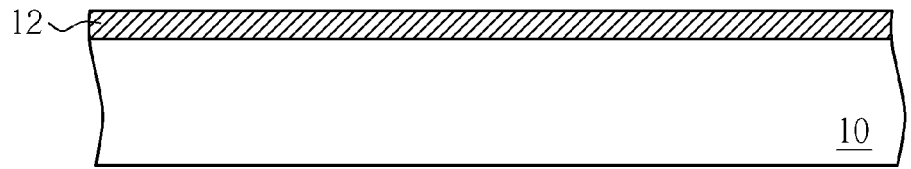
FIG. 1 to FIG. 9 are schematic diagrams illustrating a method of fabricating a touch panel in accordance with a first embodiment of the present invention.
Figure 2:
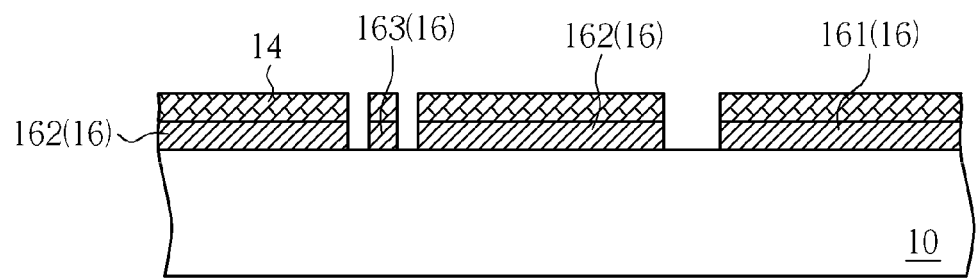
Figure 3:
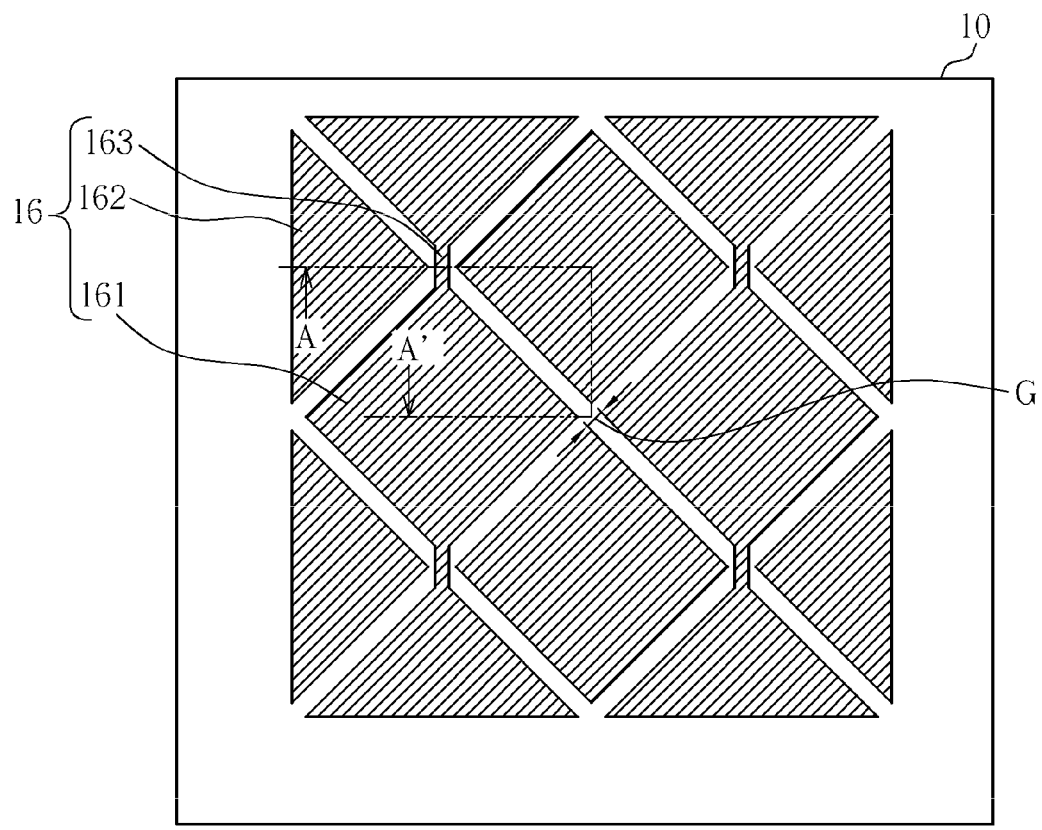
Figure 6:
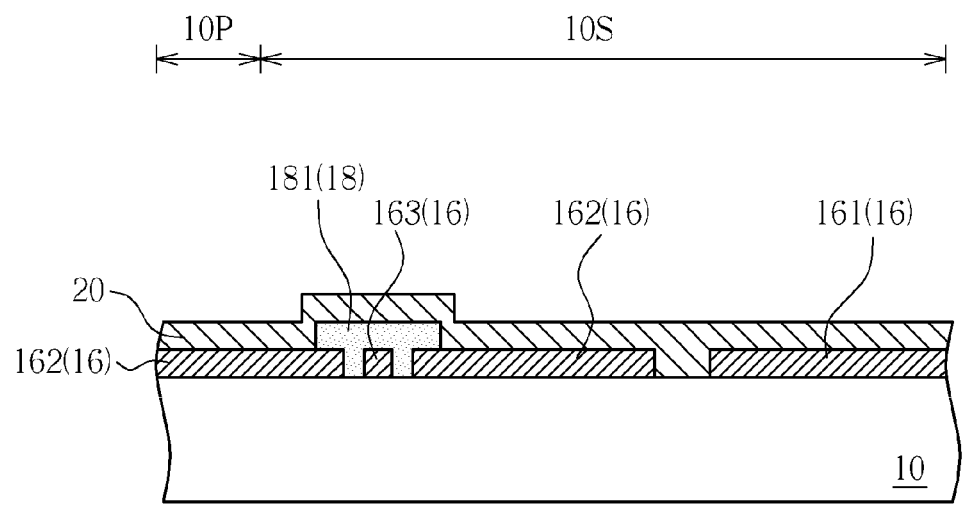
Figure 7:
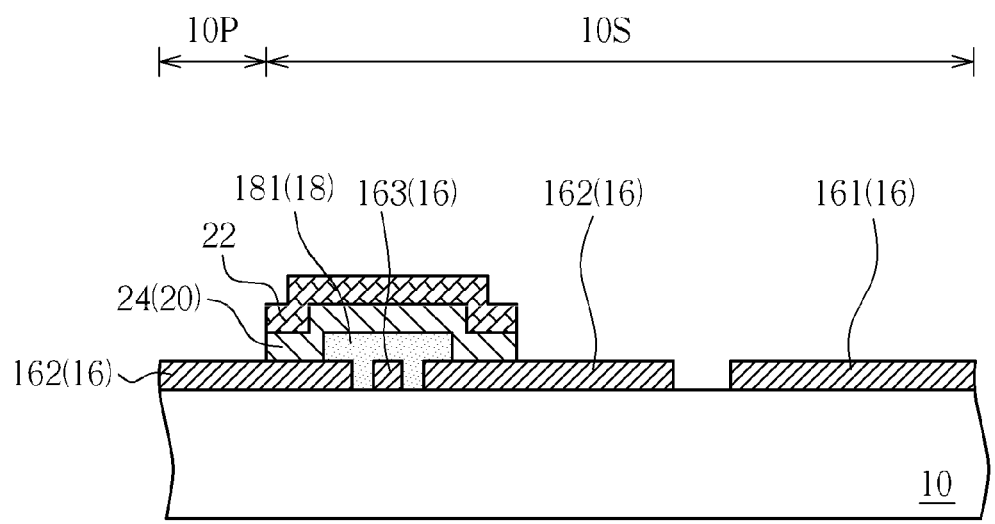
Figure 8:
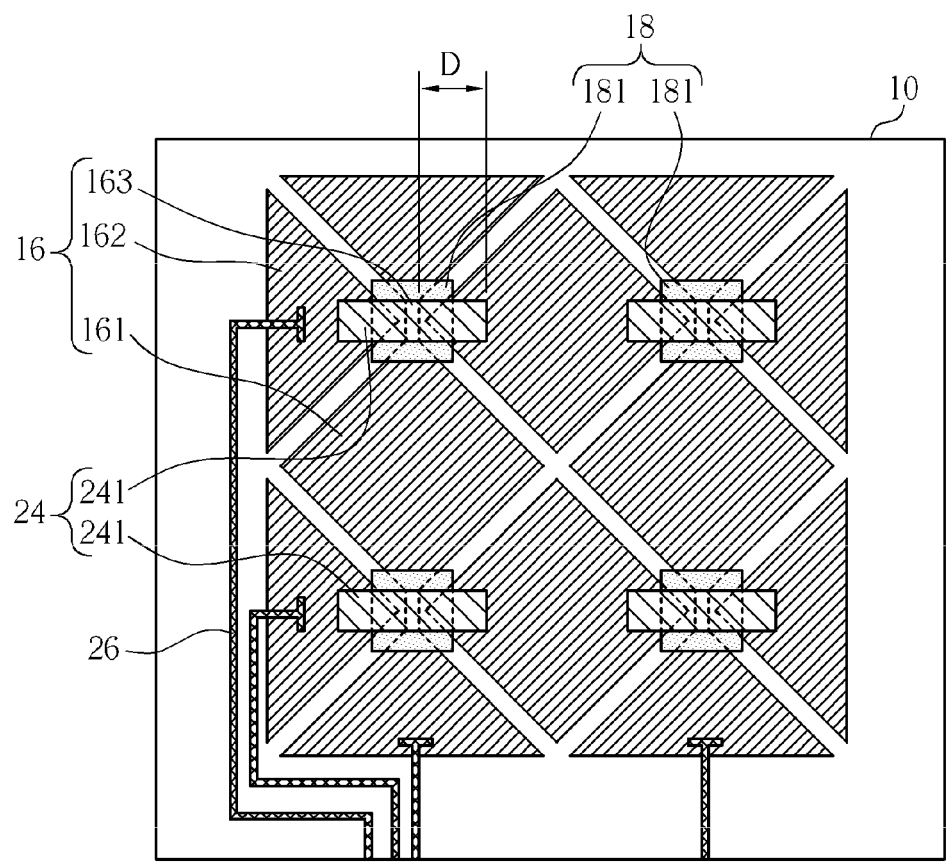

Referring to FIG. 1 to FIG. 9, FIG. 1 to FIG. 9 are schematic diagrams illustrating a method of fabricating a touch panel in accordance with a first embodiment of the present invention. To better illustrate the characteristics of the present invention, FIG. 3 and FIG. 8 are top view diagrams, and FIG. 1, FIG. 2, FIG. 4 to FIG. 7 and FIG. 9 are cross-sectional diagrams across line A-A' of FIG. 3. As illustrated in FIG. 1, a base 10 is first provided, and the base 10 at least includes a sensing region 10S for disposing sensing units and a peripheral region 10P for disposing connecting conductive wires. Next, a first transparent conductive layer 12 is formed in the sensing region 10S of the base 10. The first transparent conductive layer 12 can be made of any transparent conductive materials, and the first transparent conductive layer 12 can be formed by any kinds thin film deposition methods, e.g. physical vapor deposition or chemical vapor deposition. For instance, the first transparent conductive layer 12 in accordance with the present embodiment is made of amorphous metal oxide such as amorphous Indium Tin Oxide (ITO), and formed by such as a sputtering process, but the material and process are not limited thereto.

As illustrated in FIG. 2, a first screen printing process is subsequently performed to form a first patterned sacrificial layer 14 on the first transparent conductive layer 12, and the first transparent conductive layer 12 is patterned using the first patterned sacrificial layer 14 to form a patterned sensing pad layer 16. The first patterned sacrificial layer 14 in accordance with the present embodiment includes a patterned etching resistance layer, and thereby the step of patterning the first transparent conductive layer 12 includes performing a first etching process using the patterned etching resistance layer as an etching mask. The first etching process removes the first transparent conductive layer 12 which is not covered by the patterned etching resistance layer to form the patterned sensing pad layer 16. The first etching process can be a wet etching process using Oxalic Acid as the etching solution, but is not limited thereto. The etching solution may as well be other solutions depending on the material selections of the first transparent conductive layer 12, or else a dry etching process can also be performed for the etching process. In addition, in order to prevent damages of the patterned sensing pad layer 16 in subsequent etching processes, a phase transformation process, e.g. a first annealing process, may be optionally performed to change the phase of the patterned sensing pad layer 16 after the formation of the patterned sensing pad layer 16. For example, the material of the patterned sensing pad layer 16 in accordance with the present embodiment is amorphous ITO, and the first annealing process transforms the material of the patterned sensing pad layer 16 from amorphous metal oxide e.g. amorphous ITO to polycrystalline metal oxide e.g. polycrystalline ITO. It is preferable to use the polycrystalline metal oxide, such as polycrystalline ITO, as the material of the patterned sensing pad layer 16. The polycrystalline ITO has a high conductivity substantially being equal to that of metal. The transparent and high conductive polycrystalline ITO is a better material than amorphous ITO or metal.

Figure 4:
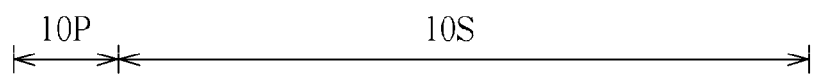
Figure 4:
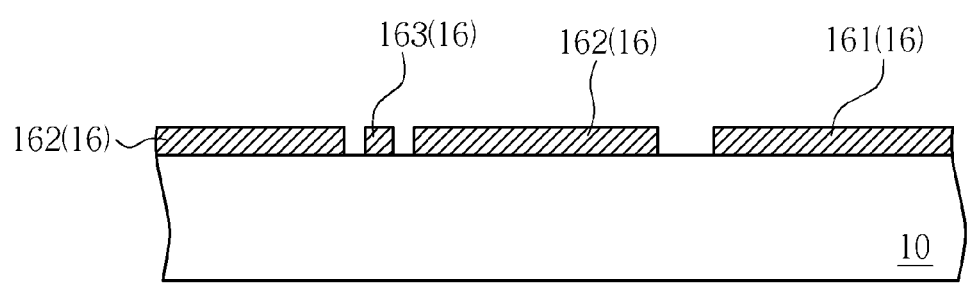

As illustrated in FIG. 3 and FIG. 4, the first patterned sacrificial layer 14 is then removed to expose the patterned sensing pad layer 16. The patterned sensing pad layer 16 includes a plurality sensing pads, e.g. a plurality of first sensing pads 161 and a plurality of second sensing pads 162, and a plurality of connecting wires 163. The first sensing pads 161 are aligned along a first direction (e.g. a perpendicular direction of FIG. 3), and any two adjacent first sensing pads 161 on a same column are connected with each other through the connecting wire 163. The second sensing pads 162 are aligned along a second direction (e.g. a horizontal direction of FIG. 3), and any two adjacent second sensing pads 162 on a same row are not connected with each other. Moreover, a gap G is disposed between any two adjacent sensing pads in accordance with the present embodiment, e.g. a gap G is disposed between the first sensing pad 161 and the second sensing pad 162 adjacent to the first sensing pad 161, and the gap G is substantially between 30 micrometers and 500 micrometers, but is not limited thereto.

Figure 5:
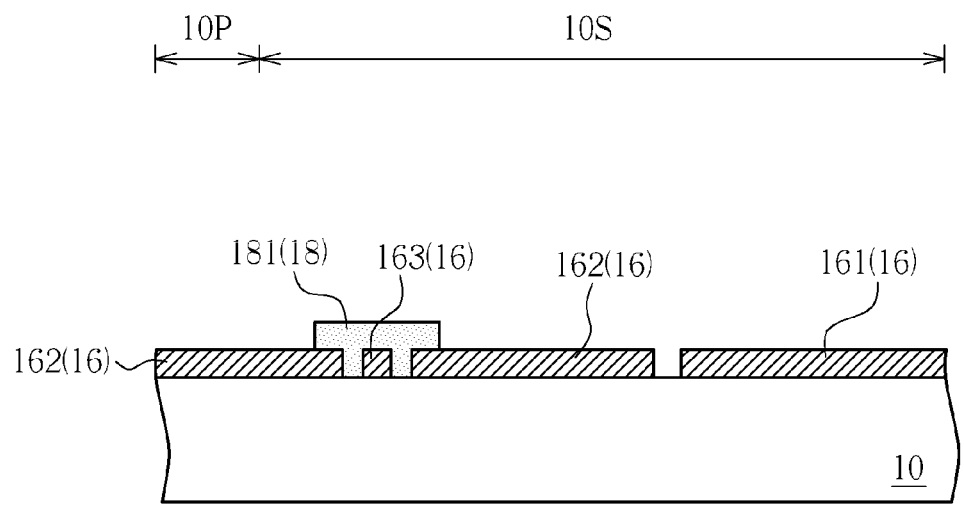

As illustrated in FIG. 5, a second screen printing process is subsequently performed to form a patterned insulating layer 18 in the sensing region 10S of the base 10. The patterned insulating layer 18 includes a plurality of insulating islands 181, and each of the insulating islands 181 is substantially corresponding to any two adjacent second sensing pads 162 on a same row respectively, and each of the insulating islands 181 covers the corresponding connecting wire 163.

As illustrated in FIG. 6, a second transparent conductive layer 20 is then formed in the sensing region 10S of the base 10. The second transparent conductive layer 20 can be made of any transparent conductive materials, and the second transparent conductive layer 20 can be formed by any kinds of thin film deposition methods, e.g. physical vapor deposition or chemical vapor deposition. For example, the second transparent conductive layer 20 in accordance with the present embodiment is made of amorphous metal oxide e.g. amorphous ITO, and the second transparent conductive layer 20 is formed by a sputtering process, but the material and process are not limited thereto.

As illustrated in FIG. 7, a third screen printing process is subsequently performed to form a second patterned sacrificial layer 22 on the second transparent conductive layer 20, and the second transparent conductive layer 20 is patterned using the second patterned sacrificial layer 22 to form a patterned bridge line layer 24. The second patterned sacrificial layer 22 in accordance with the present embodiment includes a patterned etching resistance layer, and thereby the step of patterning the second transparent conductive layer 20 includes performing a second etching process. The second etching process uses the patterned etching resistance layer as an etching mask to remove the second transparent conductive layer 20 which is not covered by the patterned etching resistance layer to form the patterned bridge line layer 24. It is to be noted that, since the material of the patterned sensing pad layer 16 in accordance with the present embodiment has transformed into polycrystalline ITO after the first annealing process, the second etching process would only etch the second transparent conductive layer 20 which is made of amorphous ITO. The second etching process would not etch the first transparent conductive layer 16 which is made of polycrystalline ITO, thereby preventing the first transparent conductive layer 16 from being damaged during the second etching process effectively.

Figure 9:
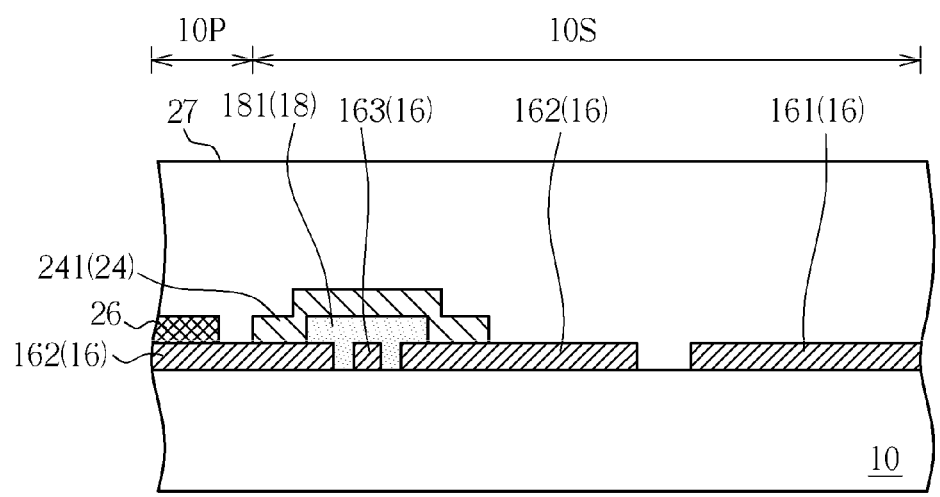

As illustrated in FIG. 8 and FIG. 9, the second patterned sacrificial layer 22 is then removed to expose the patterned bridge line layer 24. The patterned bridge line layer 24 includes a plurality of bridge lines 241, each of the bridge lines 241 is corresponding to each of the insulating islands 181 respectively, the bridge lines 241 protrude from the insulating islands 181, and each of the bridge lines 241 contacts with two adjacent second sensing pads 162 so that the two adjacent second sensing pads 162 are electrically connected with each other by the bridge lines 241. A line width of each of the bridge line 241 in accordance with the present embodiment is substantially between 50 micrometers and 500 micrometers, but is not limited thereto. Also, a distance D between an edge of each of the insulating islands 181 and an edge of the bridge line 241 corresponding to each of the insulating islands 181 is substantially between 50 micrometers and 500 micrometers, but is not limited thereto. Furthermore, after the formation of the patterned bridge line layer 24, a second annealing process may be optionally performed to transform the phase of the patterned bridge line layer 24, e.g. transform the patterned bridge line layer 24 material from amorphous ITO to polycrystalline ITO. It is preferable to use the polycrystalline metal oxide, such as polycrystalline ITO, as the material of the patterned bridge line layer 24. The polycrystalline ITO has a high conductivity substantially being equal to that of metal. The transparent and high conductive polycrystalline ITO is a better material than amorphous ITO or metal. A fourth screen printing process is subsequently performed to form a plurality of connecting conductive wires 26 in the peripheral region 10P of the base 10, and the connecting conductive wires 26 are electrically connected to the patterned sensing pad layer 16 so that input signals sensed by the patterned sensing pad layer 16 are transferred to a sensing circuit (not illustrated in the figure). For example, the connecting conductive wires 26 in accordance with the present embodiment can be made of silver conducting wires, the line width of each of the connecting conductive wires 26 is substantially between 10 micrometers and 300 micrometers, and the thickness of each of the connecting conductive wires 26 is substantially between 1 micrometer and 10 micrometers, but the materials, widths and thicknesses are not limited thereto. The connecting conductive wires 26 can also be made of other single layer or multi-layer conductive materials, and the width and thickness of the connecting conductive wires 26 can also be adjusted. Next, a passivation layer 27 (not illustrated in FIG. 7) is formed on the base 10.

Figure 10:
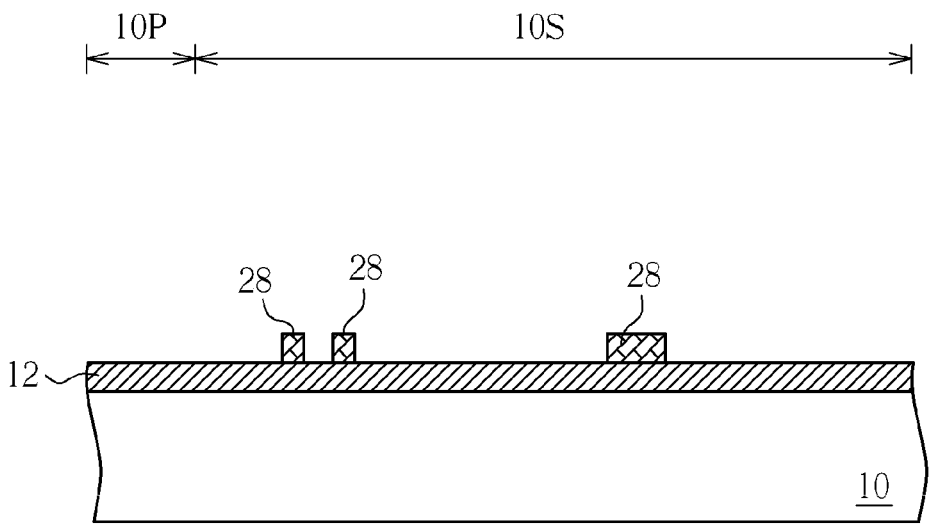
FIG. 10 to FIG. 13 are schematic diagrams illustrating the steps of patterning the first transparent conductive layer of the first embodiment and the steps of patterning the second transparent conductive layer of the first embodiment in accordance with another embodiment of the present invention.
Figure 11:
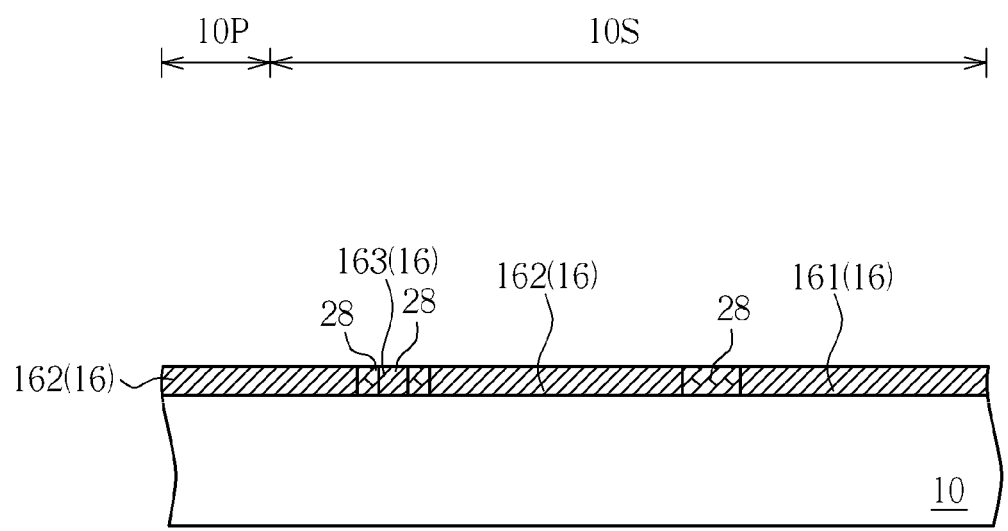
Figure 12:
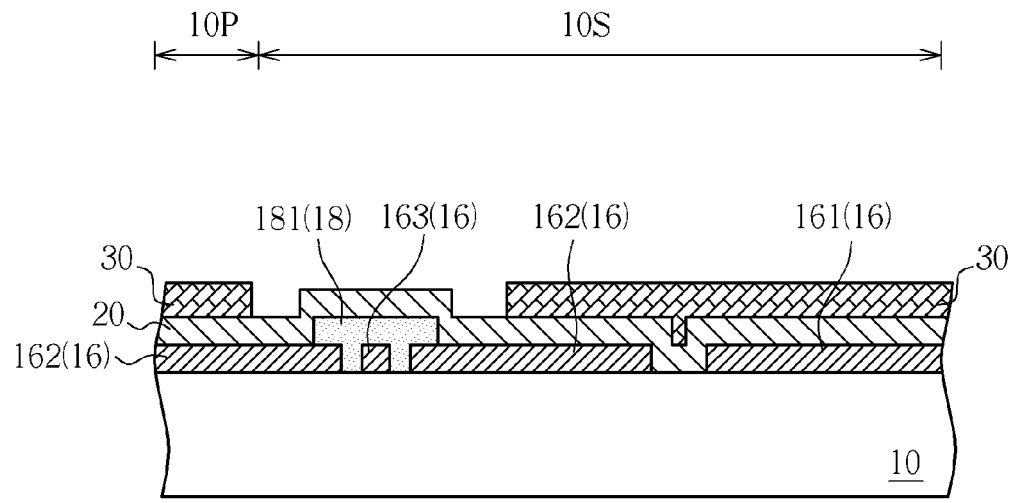
Figure 13:
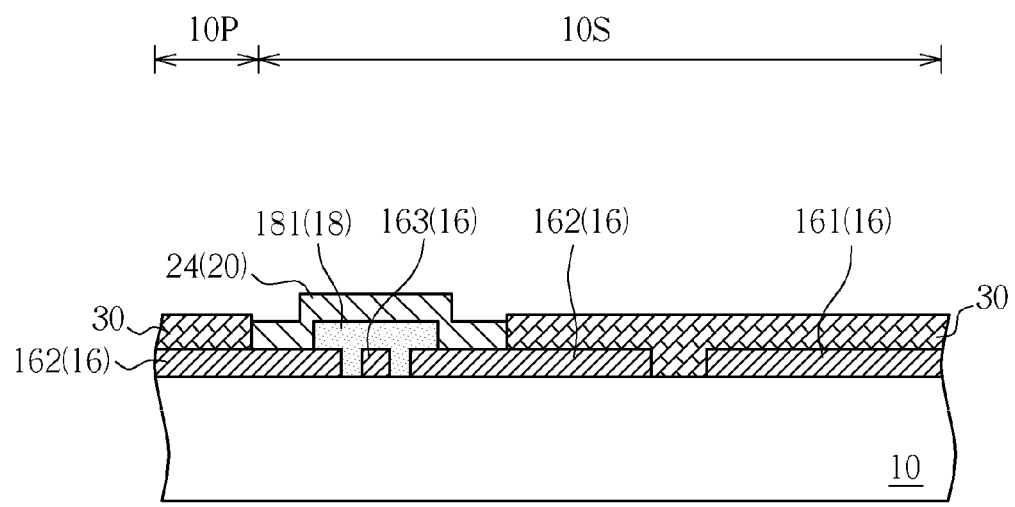

In the method of fabricating the touch panel in accordance with the present invention, the step of patterning the first transparent conductive layer 12 and the step of patterning the second transparent conductive layer 20 are not limited by using the patterned etching resistance layer, and the patterning steps may have other embodiments. Referring to FIG. 10 to FIG. 13 and FIG. 1 to FIG. 9, FIG. 10 to FIG. 13 are schematic diagrams illustrating the step of patterning the first transparent conductive layer and the step of patterning the second transparent conductive layer in accordance with another configuration of the first embodiment of the present invention. The patterning process of the first transparent conductive layer is performed by the following steps. As illustrated in FIG. 10, after the formation of the first transparent conductive layer 12, a first screen printing process is performed to form a first patterned sacrificial layer 28 on the first transparent conductive layer 12. Unlike the first patterned sacrificial layer 14 of FIG. 2, the first patterned sacrificial layer 28 in accordance with the present embodiment is a patterned etching paste layer. As illustrated in FIG. 11, the patterned etching paste layer is then used to etch the first transparent conductive layer 12 below the patterned etching paste layer to define the first sensing pads 161, the second sensing pads 162 and the connecting wires 163. Then the first patterned sacrificial layer 28 is removed. Furthermore, the patterning process of the second transparent conductive layer is performed by the following steps. As illustrated in FIG. 12, after the formation of the second transparent conductive layer 20, a third screen printing process is performed to form a second patterned sacrificial layer 30 on the second transparent conductive layer 20. Unlike the second patterned sacrificial layer 22 of FIG. 7, the second patterned sacrificial layer 30 in accordance with the present embodiment is the patterned etching paste layer. As illustrated in FIG. 13, the patterned etching paste layer is then used to etch the second transparent conductive layer 20 below the patterned etching paste layer to define the patterned bridge line layer 24. Then the second patterned sacrificial layer 30 is removed.

Figure 14:
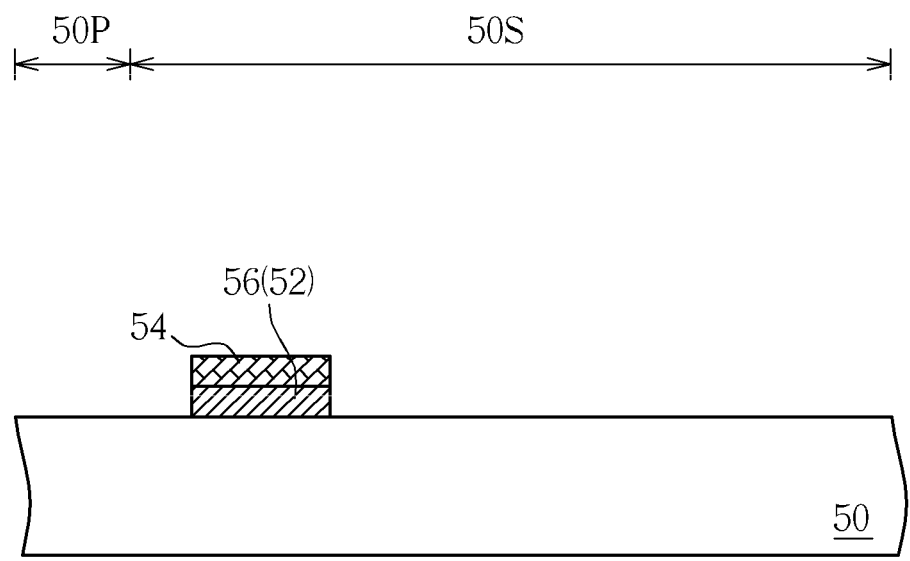
FIG. 14 to FIG. 20 are schematic diagrams illustrating the method of fabricating the touch panel in accordance with a second embodiment of the present invention.
Figure 15:
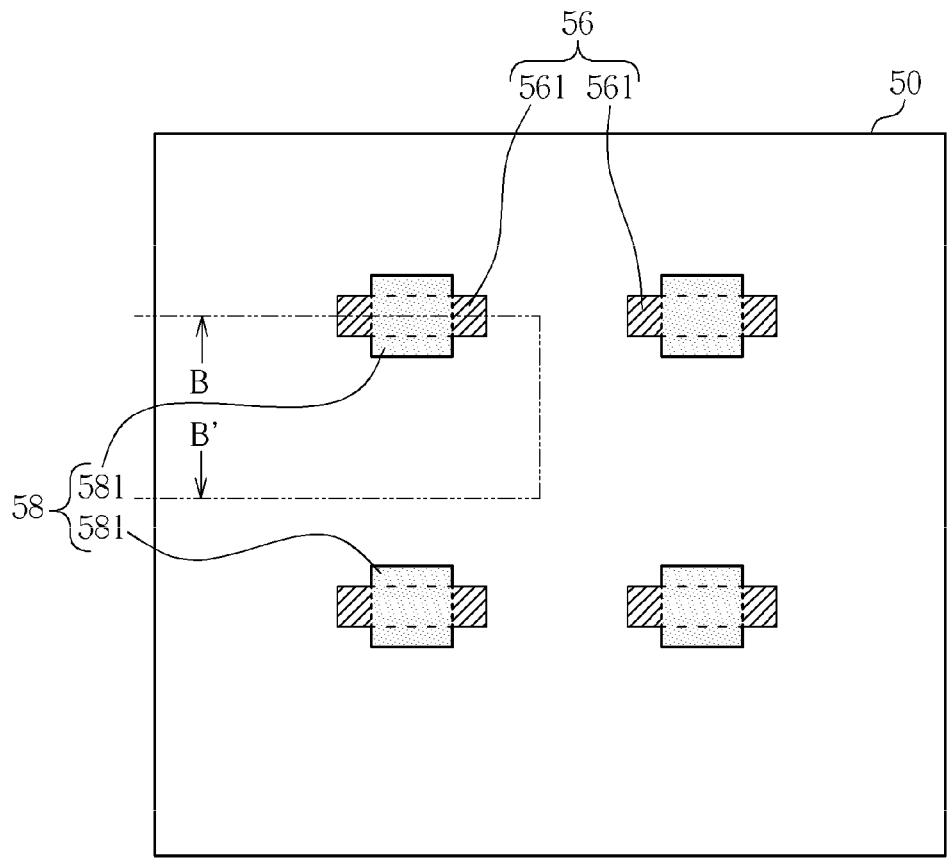
Figure 17:
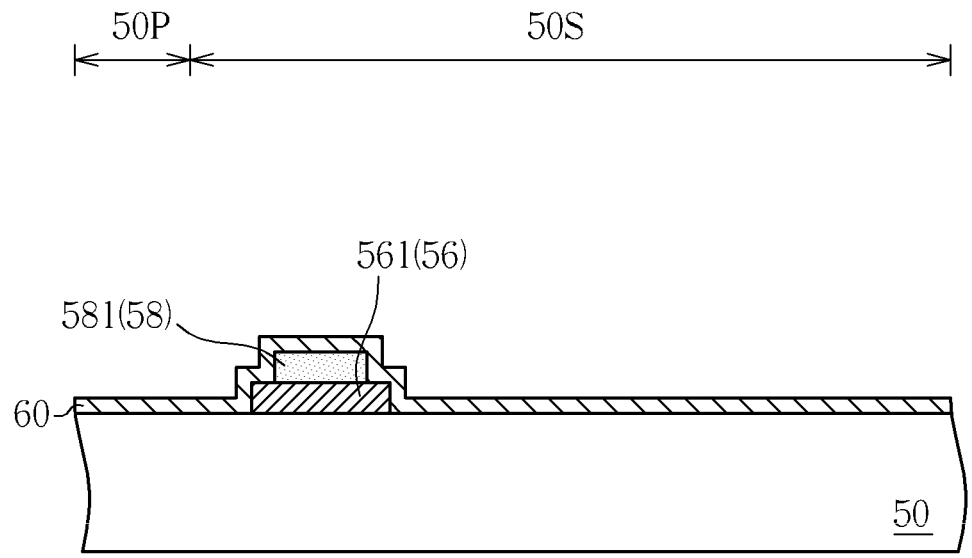
Figure 18:
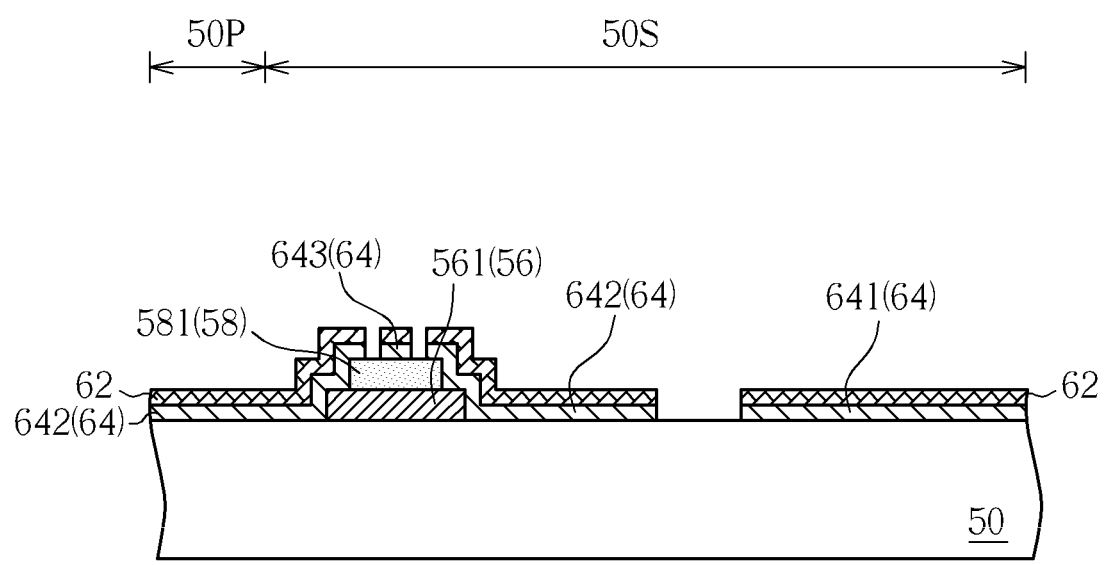
Figure 19:
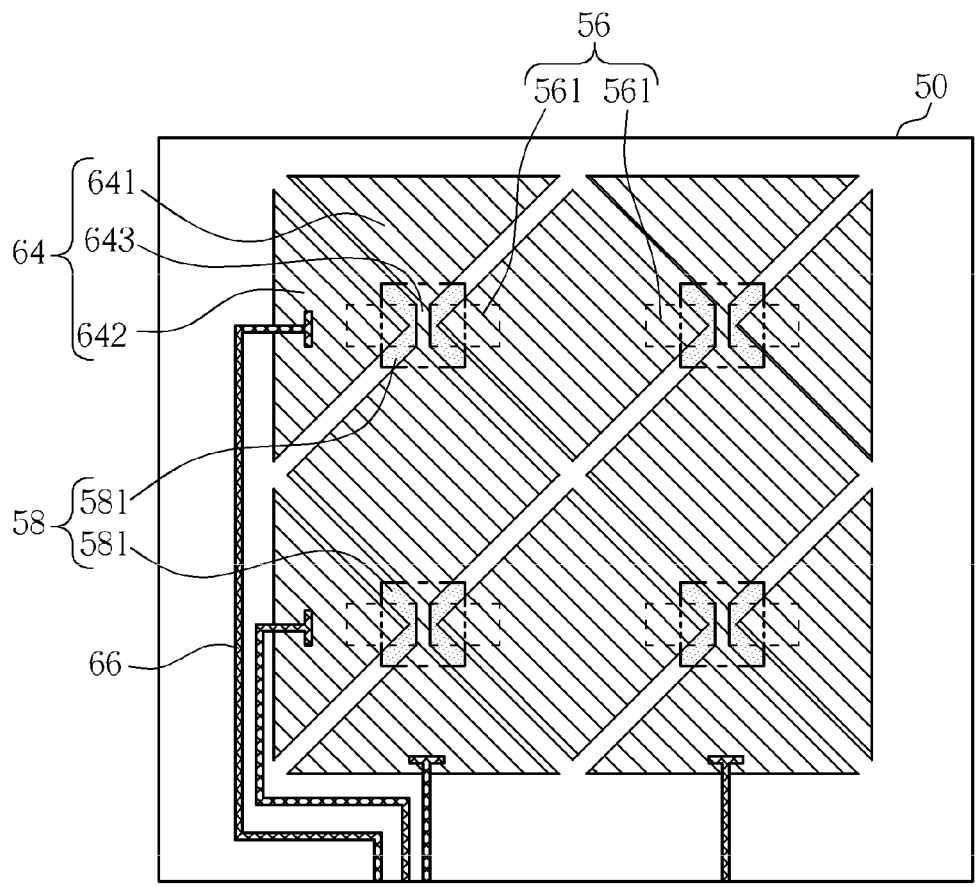

Referring to FIG. 14 to FIG. 20, FIG. 14 to FIG. 20 are schematic diagrams illustrating the method of fabricating the touch panel in accordance with a second embodiment of the present invention. To simplify the description and for the convenience of comparison between each of the embodiments of the present invention, only the differences between the first embodiment and the second embodiment are illustrated, and repeated descriptions are not redundantly given. To better illustrate the characteristics of the present invention, FIG. 15 and FIG. 19 are top view diagrams, and FIG. 14, FIG. 16 to FIG. 18 and FIG. 20 are cross-sectional diagrams across line B-B' of FIG. 15. As illustrated in FIG. 14, a base 50 is first provided, and the base 50 at least includes a sensing region 50S for disposing sensing units, and a peripheral region 50P for disposing connecting conductive wires. Next a second transparent conductive layer 52 is formed in the sensing region 50S of the base 50. Then a third screen printing process is performed to form a second patterned sacrificial layer 54 on the second transparent conductive layer 52, and the second transparent conductive layer 52 is patterned using the second patterned sacrificial layer 54 to form a patterned bridge line layer 56. The second patterned sacrificial layer 54 in accordance with the present embodiment is the patterned etching resistance layer. A second etching process is performed using the patterned etching resistance layer as an etching mask to remove the second transparent conductive layer 52 which is not covered by the patterned etching resistance layer to form the patterned bridge line layer 56. However, the second patterned sacrificial layer 54 is not limited to the patterned etching resistance layer, and the second patterned sacrificial layer 54 may be the patterned etching paste layer.

Figure 16:
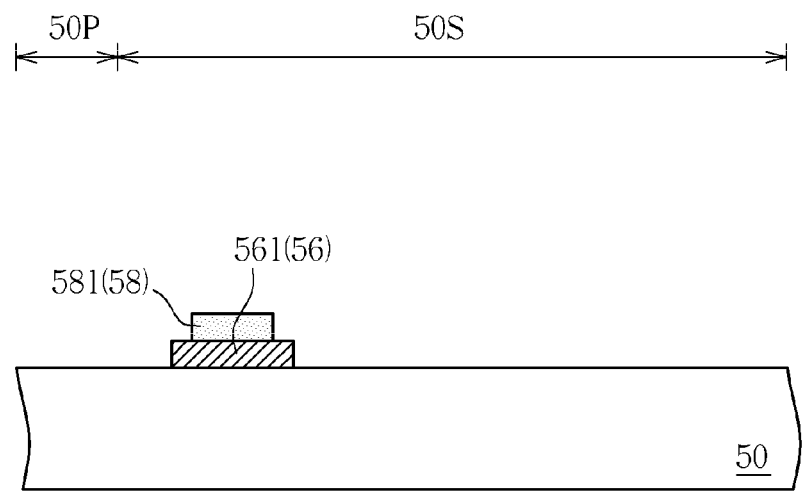

As illustrated in FIG. 15 and FIG. 16, the second patterned sacrificial layer 54 is then removed to expose the patterned bridge line layer 56. The patterned bridge line layer 56 includes a plurality of bridge lines 561. Furthermore, after the formation of the patterned bridge line layer 56, a second annealing process may be optionally performed. A second screen printing process is subsequently performed to form a patterned insulating layer 58 in the sensing region 50S of the base 50. The patterned insulating layer 58 includes a plurality of insulating islands 581. Each of the insulating islands 581 is substantially corresponding to each of the bridge lines 561, and the length of each of the insulating islands 581 is shorter than the length of the corresponding bridge line 561; therefore, two ends of each of the bridge lines 561 are exposed outside the corresponding insulating island 581.

As illustrated in FIG. 17, a first transparent conductive layer 60 is subsequently formed in the sensing region 50S of the base 50. As illustrated in FIG. 18, a first screen printing process is subsequently performed to form a first patterned sacrificial layer 62 on the first transparent conductive layer 60, and the first transparent conductive layer 60 is patterned using the first patterned sacrificial layer 62. The first patterned sacrificial layer 62 in accordance with the present embodiment is the patterned etching resistance layer. A first etching process is performed using the patterned etching resistance layer as an etching mask to remove the first transparent conductive layer 60 which is not covered by the patterned etching resistance layer to form a patterned sensing pad layer 64. The first patterned sacrificial layer 62 is not limited to the patterned etching resistance layer, and the first patterned sacrificial layer 62 may be the patterned etching paste layer.

Figure 20:
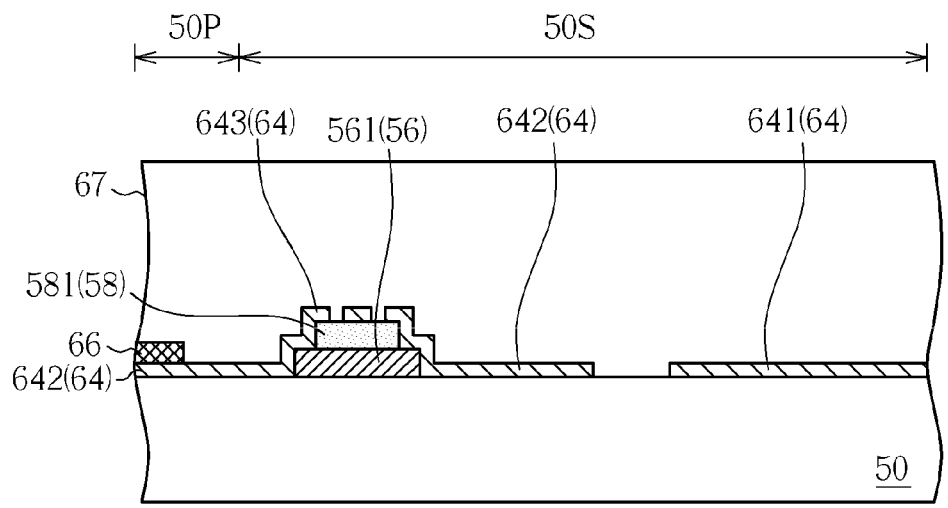

As illustrated in FIG. 19 and FIG. 20, the first patterned sacrificial layer 62 is then removed to expose the patterned sensing pad layer 64. The patterned sensing pad layer 64 includes a plurality of sensing pads, e.g. a plurality of first sensing pads 641, a plurality of second sensing pads 642 and a plurality of connecting wires 643. The first sensing pads 641 are aligned along a first direction (e.g. a perpendicular direction of FIG. 19), and any two adjacent first sensing pads 641 on a same column are connected with each other through the connecting wire 643. The second sensing pads 642 are aligned along a second direction (e.g. a horizontal direction of FIG. 19), and any two adjacent second sensing pads 642 on a same row are connected with each other by the corresponding bridge line 561. The bridge lines 561 are completely covered by the patterned sensing pad layer 64 to prevent the bridge lines 561 from being damaged during the etching process of the patterned sensing pad layer 64. In addition, after the formation of the patterned sensing pad layer 64, a first annealing process may be optionally performed. A fourth screen printing process is subsequently performed to form a plurality of connecting conductive wires 66 in the peripheral region 50P of the base 50, and the connecting conductive wires 66 are electrically connected to the patterned sensing pad layer 64. Then a passivation layer 67 (not illustrated in FIG. 17) is formed on the base 50.

Figure 21:
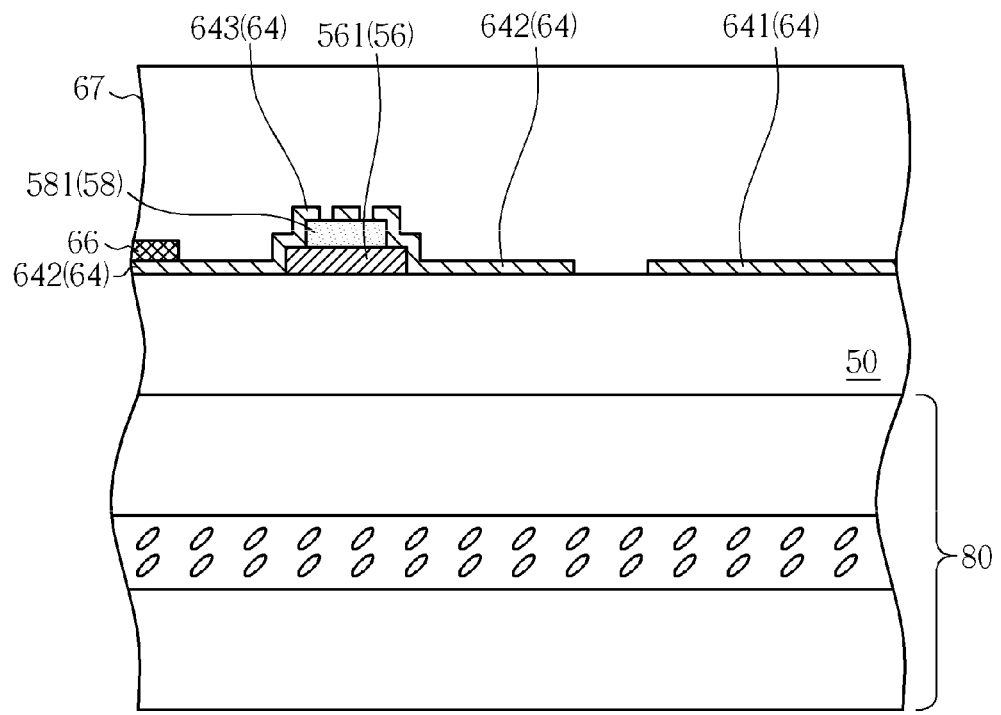
FIG. 21 and FIG. 22 are schematic diagrams illustrating the method of fabricating the touch panel in accordance with two other preferred embodiments of the present invention.
Figure 22:
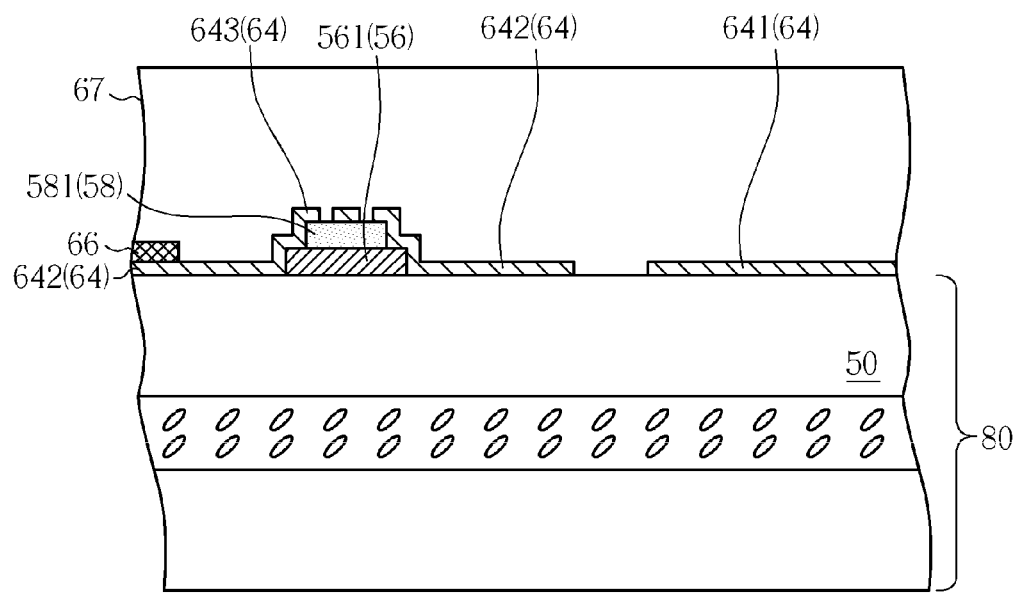

The base used in the method of fabricating the touch panel in accordance with the present invention may be any sorts of soft substrates or hard substrates, e.g. glass substrate, plastic substrate, quartz substrate and etc. Furthermore, the method of fabricating the touch panel in accordance with the present invention can be integrated with a display panel to fabricate a touch display panel. Referring to FIG. 21 and FIG. 22, FIG. 21 and FIG. 22 are schematic diagrams illustrating the method of fabricating the touch panel in accordance with two other preferred embodiments of the present invention. As illustrated in FIG. 21, the base 50 of the touch panel can be an auxiliary substrate, and the auxiliary substrate is pasted onto a display panel 80 (e.g. a liquid crystal display panel) after the fabrication of the touch panel. As illustrated in FIG. 22, the touch panel in accordance with another embodiment can share a same base with the display panel 80, so that the base 50 of the touch panel is the base of the display panel 80, e.g. a color filter glass substrate. Once the touch panel is completed, the glass substrate and other components, e.g. another substrate such as an array substrate, are then assembled into a touch display panel.

In summary, the method of fabricating the touch panel in accordance with the present invention utilizes the screen printing processes to form the patterned sacrificial layers that define the patterned sensing pad layer and the patterned bridge line layer; therefore, in comparison to the conventional method which uses a photolithography process, the method of fabricating the touch panel in accordance with the present invention can greatly reduce the manufacturing cost.

Those skilled in the art will readily observe that numerous modifications and alterations of the device and method may be made while retaining the teachings of the invention.

What is claimed is:

1. A method of fabricating a touch panel, comprising:
providing a base comprising a sensing region;
forming a first transparent conductive layer made of an amorphous metal oxide in the sensing region of the base;
patterning the first transparent conductive layer to form a patterned sensing pad layer by performing a first screen printing process using a first patterned sacrificial layer;
performing a first annealing process to transform the amorphous metal oxide of the first transparent conductive layer into a polycrystalline metal oxide;
forming a patterned insulating layer in the sensing region of the base by performing a second screen printing process;
forming a second transparent conductive layer in the sensing region of the base; and
patterning the second transparent conductive layer to form a patterned bridge line layer by performing a third screen printing process using a second patterned sacrificial layer.

2. The method of claim 1, wherein the step of patterning the first transparent conductive layer comprises forming a patterned etching resistance layer served as the first patterned sacrificial layer, and performing a first etching process to remove the first transparent conductive layer which is not covered by the patterned etching resistance layer.

3. The method of claim 1, wherein the step of patterning the first transparent conductive layer comprises forming a patterned etching paste layer served as the first patterned sacrificial layer, and removing the first transparent conductive layer below the patterned etching paste layer by using the patterned etching paste layer.

4. The method of claim 1, wherein the step of patterning the second transparent conductive layer comprises forming a patterned etching resistance layer served as the second patterned sacrificial layer, and performing a second etching process to remove the second transparent conductive layer which is not covered by the patterned etching resistance layer.

5. The method of claim 1, wherein the step of patterning the second transparent conductive layer comprises forming a patterned etching paste layer served as the second patterned sacrificial layer, and removing the second transparent conductive layer below the patterned etching paste layer by using the patterned etching paste layer.

6. The method of claim 1, comprising the sequential steps of:
(a) providing the base comprising the sensing region;
(b) forming the first transparent conductive layer in the sensing region of the base;
(c) patterning the first transparent conductive layer to form the patterned sensing pad layer by performing the first screen printing process using the first patterned sacrificial layer;
(d) forming the patterned insulating layer in the sensing region of the base by performing the second screen printing process;
(e) forming the second transparent conductive layer in the sensing region of the base; and
(f) patterning the second transparent conductive layer to form the patterned bridge line layer by performing the third screen printing process using the second patterned sacrificial layer.

7. The method of claim 1, comprising the sequential steps of:
(a) providing the base comprising the sensing region;
(b) forming the second transparent conductive layer in the sensing region of the base;
(c) patterning the second transparent conductive layer to form the patterned bridge line layer by performing the third screen printing process using the second patterned sacrificial layer;
(d) forming the patterned insulating layer in the sensing region of the base by performing the second screen printing process;
(e) forming the first transparent conductive layer in the sensing region of the base; and
(f) patterning the first transparent conductive layer to form the patterned sensing pad layer by performing the first screen printing process using the first patterned sacrificial layer.

8. The method of claim 1, further comprising performing a second annealing process after forming the patterned bridge line layer.

9. The method of claim 1, wherein the patterned sensing pad layer comprises a plurality of sensing pads, a gap is disposed between two adjacent sensing pads, and the gap is substantially between 30 micrometers and 500 micrometers.

10. The method of claim 1, wherein the patterned insulating layer comprises a plurality of insulating islands, the patterned bridge line layer comprises a plurality of bridge lines, and each of the insulating islands is corresponding to each of the bridge lines respectively.

11. The method of claim 10, wherein a line width of each of the bridge lines is substantially between 50 micrometers and 500 micrometers.

12. The method of claim 10, wherein each of the insulating islands comprises a side edge, and each of the bridge lines comprises a side edge, and a distance between a side edge of each of the insulating islands and a side edge of each of the bridge lines corresponding to the side edge of each of the insulating islands is substantially between 50 micrometers and 500 micrometers.

13. The method of claim 1, further comprising performing a fourth screen printing process to form a plurality of connecting conductive wires in a peripheral region of the base, wherein the connecting conductive wires are electrically connected to the patterned sensing pad layer.

14. The method of claim 13, wherein a line width of each of the connecting conductive wires is substantially between 10 micrometers and 300 micrometers, and a thickness of each of the connecting conductive wires is substantially between 1 micrometer and 10 micrometers.

15. The method of claim 1, wherein the base comprises a display panel.

16. The method of claim 1, wherein the base comprises an auxiliary substrate.

17. The method of claim 16, further comprising pasting the auxiliary substrate onto a display panel.

18. The method of claim 1, wherein the base comprises a glass substrate.

19. The method of claim 18, further comprising assembling the glass substrate and another substrate into a touch display panel.

\* \* \* \* \*